(12) United States Patent
Benhammou et al.

(10) Patent No.: US 12,324,250 B2
(45) Date of Patent: Jun. 3, 2025

(54) SINGLE-PHOTON AVALANCHE PHOTODIODE

(71) Applicant: STMicroelectronics (Crolles 2) SAS, Crolles (FR)

(72) Inventors: Younes Benhammou, Grenoble (FR); Dominique Golanski, Gières (FR); Denis Rideau, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 231 days.

(21) Appl. No.: 18/147,566

(22) Filed: Dec. 28, 2022

(65) Prior Publication Data

US 2023/0178677 A1 Jun. 8, 2023

Related U.S. Application Data

(62) Division of application No. 16/703,689, filed on Dec. 4, 2019, now Pat. No. 11,581,449.

(30) Foreign Application Priority Data

Dec. 19, 2018 (FR) ...................................... 1873335

(51) Int. Cl.
*H10F 30/225* (2025.01)
*H10F 10/165* (2025.01)
*H10F 71/00* (2025.01)
*H10F 77/122* (2025.01)

(52) U.S. Cl.
CPC ......... *H10F 30/225* (2025.01); *H10F 10/165* (2025.01); *H10F 71/1215* (2025.01); *H10F 77/1228* (2025.01)

(58) Field of Classification Search
None
See application file for complete search history.

(56) References Cited

U.S. PATENT DOCUMENTS

| | | | |
|---|---|---|---|
| 2007/0152289 A1 | 7/2007 | Morse et al. | |
| 2019/0229227 A1* | 7/2019 | Samani | H01L 31/105 |
| 2019/0267509 A1* | 8/2019 | Takeuchi | H01L 31/0352 |
| 2020/0203547 A1 | 6/2020 | Benhammou et al. | |

FOREIGN PATENT DOCUMENTS

| | | |
|---|---|---|
| CN | 101490856 A | 7/2009 |
| WO | WO 2014190189 A2 | 11/2014 |

OTHER PUBLICATIONS

Campbell, "Recent Advances in Avalanche Photodiodes," *Journal of Lightwave Technology* 34(2):278-285, 2016.
Hayes et al., "Modeling the effects of interface traps on passive quenching of Ge/Si geiger mode avalanche photodiode," *Opt Quant Electron* 44:119-124, 2012.
Kanbe et al., "Ge/Si Heterojunction Photodiodes Fabricated by Wafer Bonding," *Japanese Journal of Applied Physics* 45(25):L644-L646, 2006.

* cited by examiner

*Primary Examiner* — Steven M Page
(74) *Attorney, Agent, or Firm* — SEED IP LAW GROUP LLP

(57) ABSTRACT

The present disclosure relates to a photodiode comprising a first part made of silicon and a second part made of doped germanium lying on and in contact with the first part, the first part comprising a stack of a first area and of a second area forming a p-n junction and the doping level of the germanium increasing as the distance from the p-n junction increases.

17 Claims, 4 Drawing Sheets

SINGLE-PHOTON AVALANCHE PHOTODIODE

CROSS-REFERENCE TO RELATED APPLICATION

This application claims the priority benefit of French patent application number 1873335, filed on Dec. 19, 2018, the content of which is hereby incorporated by reference in its entirety to the maximum extent allowable by law.

BACKGROUND

Technical Field

The present disclosure relates generally to electronic circuits, and more particularly to single-photon avalanche photodiodes or SPAD (Single-Photon Avalanche Diode) photodiodes.

Description of the Related Art

SPAD photodiodes comprise a p-n junction reverse biased to a voltage exceeding the breakdown voltage, or avalanche voltage, of the junction. At this bias voltage, the electric field around the p-n junction is sufficient in order for a photo-generated carrier reaching the space charge zone, or depleted zone, of the junction to trigger an avalanche phenomenon that translates into an increase in the current in the photo-diode.

SPAD photodiodes are used as photodetectors. In particular, they make it possible to detect the reception of a single photon by the photodiode.

BRIEF SUMMARY

There is a need for a SPAD photodiode that addresses all or some of the drawbacks of known SPAD photodiodes.

In some embodiments, a SPAD photodiode of the disclosed techniques is suitable for detecting photons in the near infrared, for example, between approximately 950 nm and approximately 1500 nm, preferably between 950 nm and 1500 nm.

In some embodiments, a SPAD photodiodes of the disclosed techniques is suitable for detection in the near infrared.

Some embodiments provide a SPAD photodiode suitable for detection in the near infrared, in which noise is lower than in known SPAD photodiodes suitable for detection in the near infrared.

Some embodiments provide a SPAD photodiode suitable for detection in the near infrared, the manufacturing method of which is compatible with the usual manufacturing methods used in CMOS technology.

Some embodiments provide a SPAD photodiode suitable for detection in the near infrared, operating at a bias voltage compatible with portable applications, for example, at a bias voltage less than 20 V.

Thus, some embodiments provide a photodiode comprising a first part made of silicon and a second part made of doped germanium lying on and in contact with the first part, the first part comprising a stack of a first area and of a second area forming a p-n junction and the doping level of the germanium increasing as the distance from the p-n junction increases.

According to some embodiments, the first area is doped with a first type of conductivity and the second area is doped with a second type of conductivity opposite to the first type of conductivity, the second area lying on and in contact with the first area and the germanium being doped with the second type of conductivity.

According to some embodiments, the second part made of germanium lies on and is in contact with the second area of the first part.

According to some embodiments, the first part further comprises a doped layer with the first type of conductivity, disposed in the second area, under and in contact with the second part.

According to some embodiments, doping levels of the first part made of silicon are determined so that, at a given bias voltage of the photodiode exceeding the avalanche voltage of the p-n junction, the second area is depleted across its entire thickness between the p-n junction and the germanium.

According to some embodiments, the doping levels are further determined so that, at the given bias voltage, the germanium is not depleted.

According to some embodiments, the doping levels are further determined so that, at the given bias voltage, at a face of the first part on which the second part lies, the interface between the first and second parts is depleted.

According to some embodiments, the doping levels are further determined so that, at the given bias voltage, a potential barrier corresponding to a heterojunction between the first and second parts is suppressed.

According to some embodiments, the second part fills a cavity extending into the second area of the first part.

According to some embodiments, the first part further comprises an annular area more heavily doped with the second type of conductivity than the second area, the annular area surrounding the second part at the bottom of the cavity.

Some embodiments provides a method for manufacturing a photodiode as defined above, the method comprising the following successive steps: (a) forming a first area made of doped silicon with a first type of conductivity; (b) forming, on and in contact with the first area, a second area made of doped silicon with a second type of conductivity; and (c) forming germanium by epitaxy from the second area and doping the germanium with the second type of conductivity so that the doping level of the germanium increases as the distance from a p-n junction formed by the first and second areas increases.

According to some embodiments, step c) comprises the following successive steps: c1) etching a cavity into the second area; and c2) forming germanium by epitaxy from the second area so as to fill said cavity.

According to some embodiments, the method further comprises, between the steps b) and c), a step of doping a part of the second area in order to form therein an annular area that is more heavily doped with the second type of conductivity than the second area, the annular area being intended to be in contact with and to surround the germanium at the bottom of the cavity.

According to some embodiments, the method further comprises, before the formation of the germanium by epitaxy, a step of doping the second area in order to form a doped layer with the first type of conductivity intended to be inserted between the doped second area with the second type of conductivity and the germanium.

According to some embodiments, in the step a), the first area is formed in a substrate made of silicon, the step b) comprising the following successive steps: b1) forming a layer of silicon by epitaxy from the substrate; and b2) forming the second area by doping a portion of the epitaxial silicon layer lying on and in contact with the first area with the second type of conductivity.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the embodiments described herein have been illustrated and described in detail. In particular, a SPAD photodiode may be associated with a quenching circuit that makes it possible to stop the avalanche effect before the photodiode is destroyed by reducing the voltage at the terminals of the photodiode to below the breakdown voltage, the quenching circuit also making it possible to then return the voltage at the terminals of the photodiode to a value enabling a detection of a photon by avalanche effect. The different quenching circuits have not been described, the described embodiments being compatible with any quenching circuits. Moreover, the applications and electronic circuits, in particular integrated circuits, in which SPAD photodiodes are provided have not been described in detail, the described embodiments being compatible with any applications and any electronic circuits in which SPAD photodiodes are provided.

Unless indicated otherwise, when reference is made to two elements that are connected to each another, this means directly connected without any intermediate elements other than conductors, and when reference is made to two elements that are coupled or coupled to each other, this means that these two elements can be connected or be coupled or coupled by way of one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

In the following disclosure, the semiconductor area is considered depleted when the concentration of charge carriers in this area is, for example, less than $10^{10}$ cm$^{-3}$.

Figure 1:
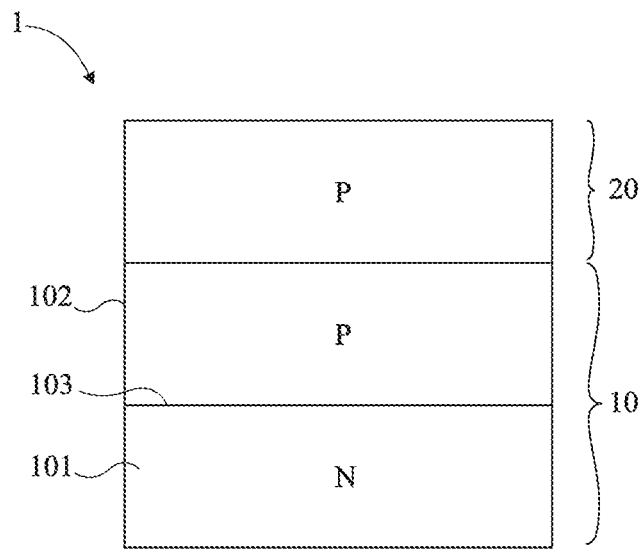
FIG. 1 illustrates, in a sectional view, an embodiment of a SPAD photodiode.

FIG. 1 illustrates, very schematically and in a sectional view, an embodiment of a SPAD photodiode 1.

The photodiode 1 comprises a part 10 made of silicon with a part 20 made of germanium mounted on top of it. The part 20 made of germanium lies on and in contact with the part 10 made of silicon.

The part 10 made of silicon comprises a doped area 101 with a first type of conductivity, in this example n-type. For instance, the area 101 is a portion of an n-type doped layer of silicon. The part 10 made of silicon further comprises an area 102 doped with a second type of conductivity opposite to the first type, in this example p-type. For instance, the area 102 is a portion of a p-type doped layer of silicon.

The area 102 lies on and in contact with the area 101. The areas 101 and 102 thus form a p-n junction 103. The breakdown voltage Vb of the p-n junction 103 is determined by the doping levels of the areas 101 and 102.

In some embodiments, the part 20 made of germanium lies on and in contact with the area 102 made of silicon.

The part 20 made of germanium is doped with the second type of conductivity, in this example p-type, same as the area 102. Moreover, the doping level or concentration of the part 20 increases as the distance from the p-n junction 103 increases. That is, the doping concentration in the part 20 gradually increases from a surface that is proximal to the p-n junction 103 to a surface that is distal to the p-n junction 103. Thus, in the example of FIG. 1, the part 20 made of germanium is more heavily doped at a top portion than at a bottom portion that is proximal to the p-n junction 103.

When a photon reaches the part 20 made of germanium, an electron-hole pair is generated therein. The minority carrier of the electron-hole pair in relation to the doping type of the germanium 20, in this example the electron of the electron-hole pair, is guided towards the part 10 since the doping level of the part 20 made of germanium decrease the toward the p-n junction 103s.

Moreover, the provision of a part 20 made of germanium rather than of silicon makes it possible to increase the probability that a photon in the near infrared that reaches the part 20 engenders the creation of an electron-hole pair leading to an avalanche phenomenon.

During operation, a bias voltage Vp is applied between first and second terminals (not shown) of the photodiode in order to reverse-bias the p-n junction 103. The first terminal of the photodiode 1 is electrically coupled, for example, connected, to the part 20 made of germanium, for example, to a portion of the part 20 disposed on the side opposite the part 10, and the second terminal of the photodiode 1 is electrically coupled, for example, connected, to the area 101 of the part 10.

In an initial or rest state, i.e., before a photon triggers an avalanche phenomenon in the photodiode 1, the voltage Vp has a given value equal to the breakdown voltage Vb of the p-n junction 103 plus an excess voltage Vex, in order to place the photodiode 1 in a Geiger or SPAD mode.

At this voltage Vp, the doping levels of the areas 101 and 102 made of silicon are chosen so that, at rest, the space charge zone of the p-n junction 103 reaches the part 20 made of germanium without, however, extending into this part 20. In other words, the doping levels of the areas 101 and 102 are chosen so that, at this voltage Vp, the area 102 of the part 10 made of silicon is depleted across its entire thickness between the p-n junction 103 and the germanium 20, without the germanium being depleted.

As a result, the electric field in the space charge zone of the p-n junction does not penetrate the germanium. Moreover, since the space charge zone of the p-n junction 103 extends up to the germanium of the part 20, the interface between the germanium 20 and the silicon 10 is depleted.

The germanium-silicon interface is considered depleted here when the potential barrier corresponding to the heterojunction between the germanium 20 and the silicon 10 is suppressed, which, if not suppressed, would block an electron photogenerated in the part 20 from moving towards the part 10. Put differently, the doping levels of the areas 101 and 102, and in some embodiments the doping levels of the germanium 20, are chosen so that, at the rest voltage Vp, the interface is depleted and the barrier corresponding to the heterojunction is suppressed.

When a photon in the near infrared reaches the part 20 made of germanium and generates an electron-hole pair there, the photogenerated electron is guided in the direction of the p-n junction 103, up until the part 10, by the gradual variation of the doping level in the germanium 20 so that it reaches the space charge zone of the p-n junction 103 where it triggers an avalanche phenomenon. As a result, the current flowing between the first and second terminals of the photodiode 1 is increased, translating the reception of a photon by the photodiode 1, more specifically by its part 20 made of germanium.

A quenching circuit not shown here then makes it possible to reduce the voltage Vp to a value lower than the value of the voltage Vb, so as to stop the avalanche phenomenon. Then this same quenching circuit makes it possible to restore the rest value of the voltage Vp so that the photodiode 1 is ready to detect another photon.

The gradual replacement of the doped part 20 made of germanium with undoped (intrinsic) germanium could have been conceivable. However, in order for a photogenerated electron in the germanium to be able to initiate an avalanche phenomenon, it would then have been necessary for the space charge zone of the p-n junction to penetrate the intrinsic germanium, and thus extend across the entire thickness of the intrinsic germanium. This would have led to the presence of an electric field along the entire thickness of the germanium. This electric field would have produced an increase in noise compared with the case of the photodiode 1 of FIG. 1, i.e., an increase in the probability that a parasitic charge carrier is generated in the portion 20 made of germanium without a photon having been received.

Furthermore, it could have been conceivable to replace the p-n junction 103 of the part 10 made of silicon with a PiN-type junction by inserting an undoped zone, or intrinsic zone, between the areas 101 and 102. However, compared to a p-n junction, a PiN junction has a higher breakdown voltage which is desirable in some application scenarios and is not desirable in some other application scenarios like portable or mobile applications where one seeks to minimize power consumption.

Figure 2:
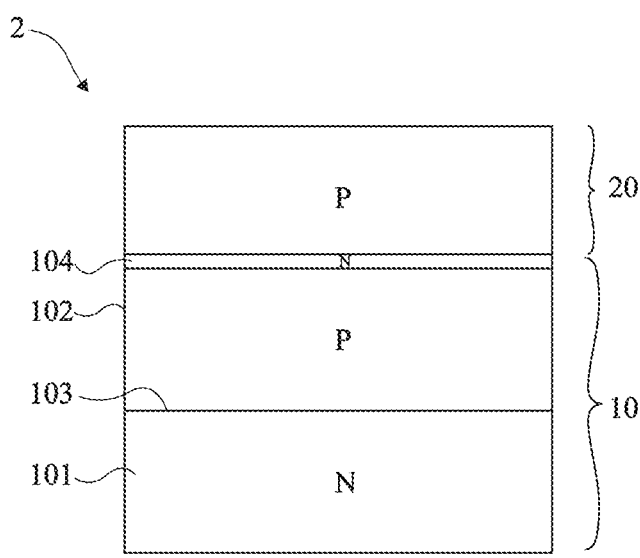
FIG. 2 illustrates, in a sectional view, a further embodiment of a SPAD photodiode.

FIG. 2 illustrates, very schematically and in a sectional view, a further embodiment of a SPAD photodiode 2.

The photodiode 2 comprises the same elements as the photodiode 1, which are designated by the same references. The photodiode 2 differs from the photodiode 1 in that a layer or a layer portion 104 doped with the type of conductivity opposite that of the area 102, here n-type, is provided in the part 10 made of silicon. The layer 104 is inserted between the part 20 and the area 102 with which it is in contact. The layer 104 extends under all or a part of the contact surface between the parts 10 and 20. In this example, the layer 104 is disposed, or extends, in the area 102, under and in contact with the part 20 made of germanium.

The provision of the layer 104 makes it possible to suppress the potential barrier, in this example for the photogenerated electrons guided from the part 20 towards the part 10, corresponding to the heterojunction between the germanium 10 and the silicon of the area 102.

The doping levels of the areas 101 and 102 and of the layer 104 are determined in a manner similar to what has been described in relation to FIG. 1. More precisely, these doping levels are chosen so that, at the rest voltage Vp, the area 102 is depleted across its entire thickness between the junction 103 and the germanium 20, the interface between the germanium 20 and the silicon 10 being depleted without the germanium being depleted.

Although the provision of the layer 104 creates, in this example for the photogenerated electrons guided from the part 20 towards the part 10, a supplementary potential barrier corresponding to the junction between the layer 104 and the area 102, this barrier is suppressed when the photodiode is biased to its rest voltage Vp since the area 102 is depleted from the p-n junction 103 up until the layer 104.

According to a particular embodiment, in the photodiodes 1 and 2 described above:
- the thickness of the area 20 made of germanium is, for example, comprised between 300 nm and 600 nm;
- the thickness of the area 102, between the p-n junction 103 and the germanium 20, is, for example, comprised between 450 nm and 600 nm;
- the thickness of the layer 104, when provided, is, for example, comprised between 8 nm and 20 nm;
- the doping level of the part 20 made of germanium is, for example, approximately $1*10^{18}$ at·cm$^{-3}$ at its lower face in contact with the part 10, and increases, for example, up to approximately $5*10^{19}$ at·cm$^{-3}$ at its upper face;
- the doping level of the area 102 is, for example, approximately $1.2*10^{17}$ at·cm$^{-3}$;
- the doping level of the area 101 is, for example, approximately $1*10^{18}$ at·cm$^{-3}$; and
- the doping level of the layer 104, when provided, is, for example, approximately $5*10^{16}$ at·cm$^{-3}$.

For this particular embodiment, the breakdown voltage of the p-n junction is in the order of 17.5 V, while the excess voltage Vex, which makes it possible to place the photodiode in Geiger or SPAD mode and to deplete the area 102 in the manner described in the foregoing, is, for example, in the order of 2 V.

Naturally, the present disclosure is not limited to this particular embodiment. Indeed, based on the functional guidelines indicated above, those skilled in the art are able to determine the thickness and/or the doping levels of the part 20 and of the various areas or layers of the part 10 as a function of the target bias voltage Vp at rest.

An example of an embodiment of a method for manufacturing an example of a photodiode 2 will now be described in relation to FIGS. 3 to 8. The various masks used, for example, during the steps of etching and doping, have not been described in detail so as not to weigh down the disclosure, those skilled in the art being able to determine the materials and the shapes of these masks based on the description of the method indicated below.

Figure 3:
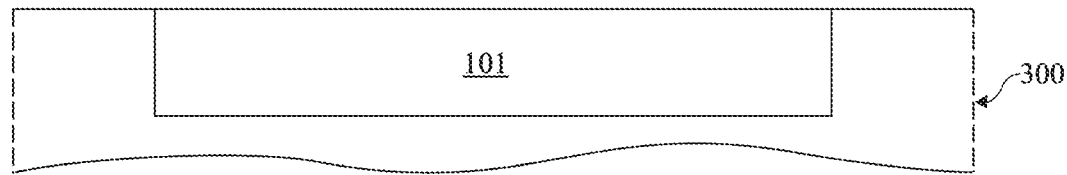
FIGS. 3-8 are sectional views of a structure at various stages of manufacturing a SPAD photodiode of the type described in relation to FIG. 1 under an example method.

FIG. 3 is a schematic sectional view of a structure at a stage of the manufacturing method.

In this stage, a substrate made of silicon 300 is, here n-type, doped in order to form the area 101 in the same. The area 101 extends into the substrate 300 from its upper face.

In this example, during the doping process, only a part of the upper surface of the substrate 300 is exposed so that the area 101 forms a doped box in the substrate. For instance, in a top view not shown, the area 101 has the shape of a square with sides of, for example, approximately 13 μm. The thickness and/or the doping level of the area 101 can be those indicated in the foregoing as examples.

As a variant, the entire upper surface of the substrate is exposed so that the area 101 forms a doped layer under the entire upper surface of the substrate.

Figure 4:
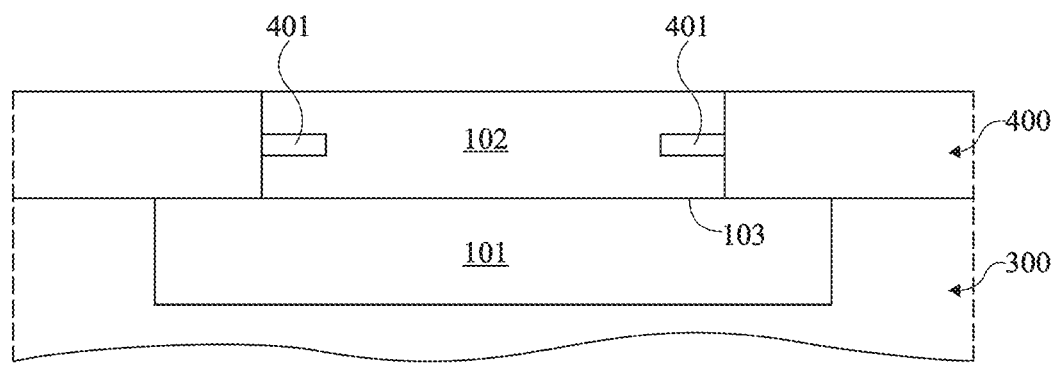

FIG. 4 is a schematic sectional view of the structure of FIG. 3 at another stage of the manufacturing method.

In this stage, a silicon layer 400 is formed by epitaxy from the substrate 300. The thickness of the layer 400 is, for example, comprised between 750 nm and 1.2 μm.

The layer 400 is then, in this example p-type, doped in order to form the area 102 within the layer 400. In some embodiment, the area 102 extends or penetrates across the entire thickness of the layer 400 so that it forms the p-n junction 103 with the area 101. The area 102 is, for example, formed only in a part of the layer 400 lying on the area 101. Preferably, the area 101 laterally extends beyond the lateral edges of the area 102.

For instance, in a top view not shown, the area 102 has the shape of a square with sides, for example, of approximately 8 μm. Preferably, in a top view, the square formed by the area 101 and the square formed by the area 102 are concentric. The thickness and/or the doping level of the area 101 can be those indicated in the foregoing as examples.

In some embodiments, it is further provided that the germanium layer 20 is surrounded by an optional annular area 401 (not illustrated in the top view), disposed in the area 102, and being more heavily p-type doped than the area 102. The area 401 is intended to be in contact with the lateral edges of the part 20 made of germanium, at the lower face of the part 20, i.e., the face of the germanium traversed by the photogenerated carriers. The area 401 is, for example, formed by doping the area 102, for example, by so-called deep implantation of doping agents in the area 102, at the site where one wishes to form the area 401.

Figure 5:
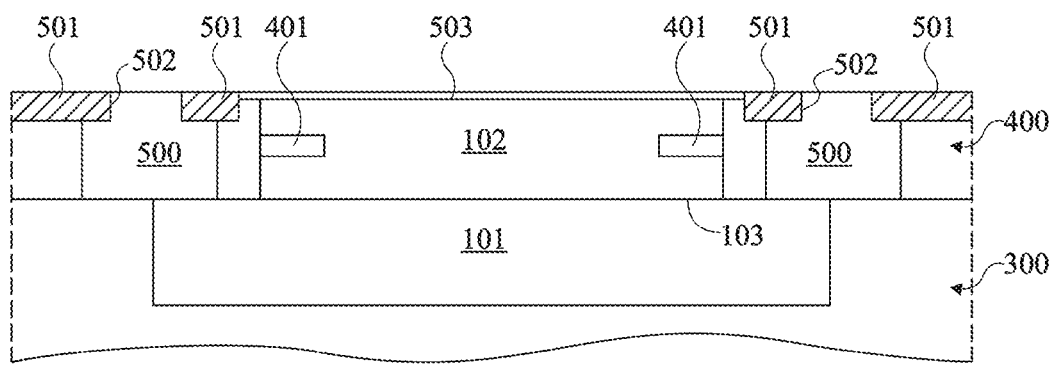

FIG. 5 is a schematic sectional view of the structure of FIG. 4 at another stage of the manufacturing method.

In some embodiments, areas 500 for contacting the area 101 are formed in the layer 400, by n-type doping the layer 400 across its entire thickness at the desired site of the areas 500. Preferably, the areas 500 are more heavily n-type doped than the area 101.

In some embodiments, an electrically isolating annular structure 501, here a shallow trench isolation or STI, is formed from the surface of the layer 400, around the area 102. In this example, the isolating trench 501 is not in contact with the area 102. In this example embodiment, openings 502 are provided in the isolating trench 501 so that the areas 500 end, through these openings, at the level of the upper surface of the layer 400.

In some embodiments, an optional process of passivating the upper surface of the area 102 is provided. During this process, a heavily p-type doped layer 503 is formed over the entire upper surface of the area 102, the layer 503 extending in this example to the isolating trench 501. For instance, the layer 503 is formed during a doping process by implantation. The presence of such a layer 503 makes it possible to limit the generation of parasitic charge carriers at the upper surface of the area 102.

Figure 6:
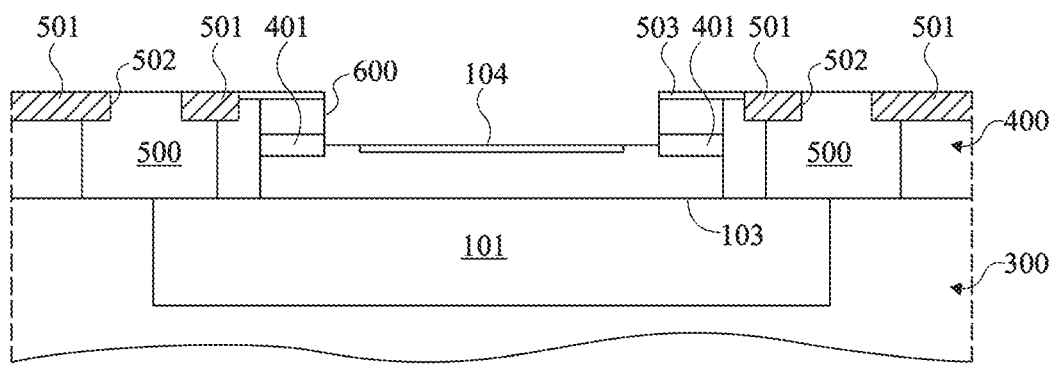

FIG. 6 is a schematic sectional view of the structure of FIG. 5 at another stage of the manufacturing method.

At this stage, a cavity 600 is etched into the area 102. For instance, in a top view not shown, the cavity 600 has the shape of a square with sides, for example, of approximately 6 μm. The cavity 600 only penetrates the area 102 along a part of its thickness. More particularly, the depth of the cavity 600 is configured such that the thickness left in place of the area 102, between the bottom of the cavity 600 and the p-n junction 103, corresponds to a thickness determined by the doping levels and the rest voltage Vp of the photodiode so as to achieve the operation described in the foregoing.

In some embodiments, where the area 401 exists, the dimensions of the cavity 600 and of the area 401 are chosen so that the area 401 extends to the lateral walls of the cavity. Moreover, the depth at which the area 401 is formed in the stage described in relation to FIG. 4 is such that the bottom of the cavity 600 is preferably at an intermediate level of the area 401.

In some embodiments, the manufactured photodiode is the same type as that of FIG. 2 and the layer 104 is formed at the bottom of the cavity 600, by doping the area 102. Preferably, as shown here, the layer 104 does not extend up to the lateral walls of the cavity 600. In the case, not illustrated here, where the manufactured photodiode is the same type as that of FIG. 1, this stage of forming the layer 104 is omitted.

Figure 7:
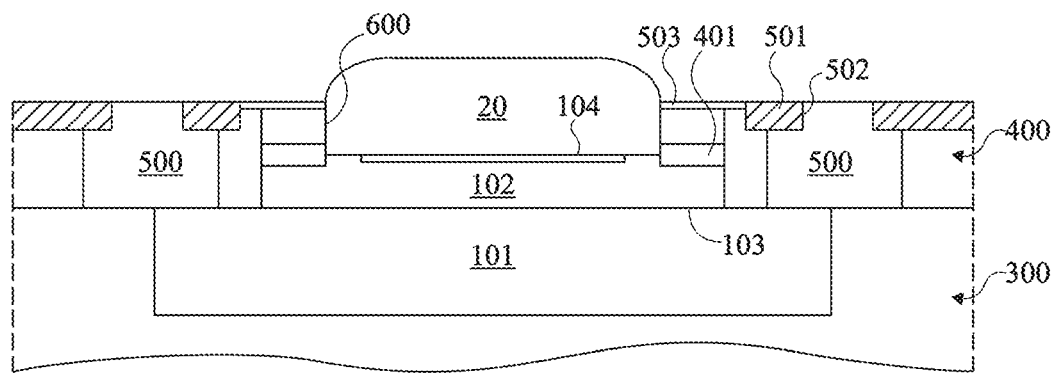

FIG. 7 is a schematic sectional view of the structure of FIG. 6 at another stage of the manufacturing method.

In this stage, the part 20 made of germanium is formed in the cavity 600 so as to fill the cavity 600, or even to extend beyond the upper face of the layer 400. The germanium is formed by selective epitaxy, in the cavity 600 only. For this purpose, the mask (not shown) used in the preceding stage for etching the cavity 600 can be left in place during the epitaxy of the germanium.

The part 20 made of germanium is, for example, doped in-situ during epitaxy. As a variant, the part 20 is doped after its formation in the cavity 600.

Figure 8:
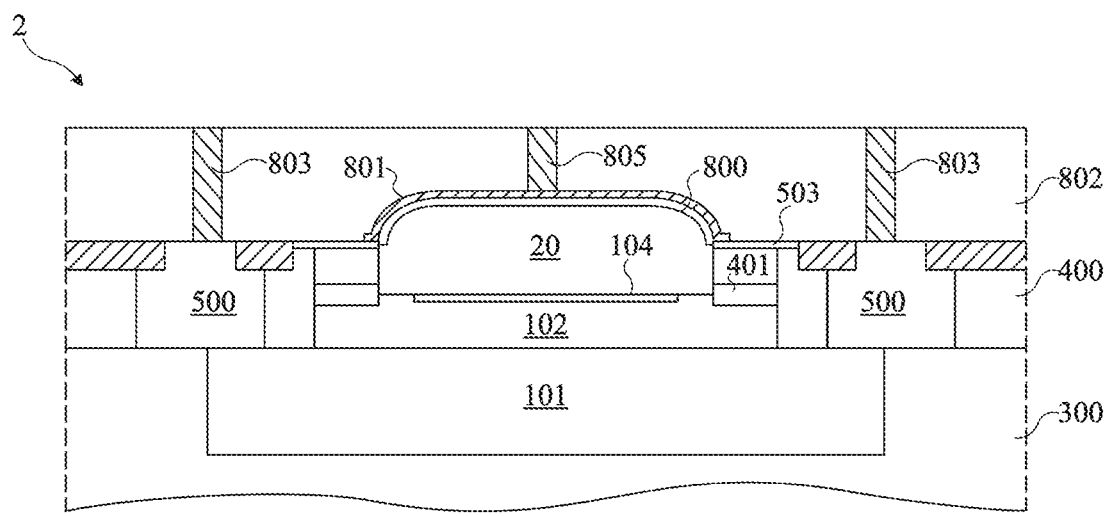

FIG. 8 is a schematic sectional view of the structure of FIG. 7 at another stage of the manufacturing method.

In this stage, an optional heavily p-type doped layer 800 has been formed in the part 20 made of germanium, over the entire exposed surface of the part 20. This layer 800 is a passivation layer that makes it possible to reduce the generation of parasitic charge carriers in the part 20 made of germanium. This layer 800 also acts here as an electric contact.

An optional insulating protective layer 801 is deposited over the entire exposed surface of the part 20 made of germanium, the layer 801 extending here onto the portion 201, around the part 20 made of germanium. For instance, the layer 801 is a layer of nitride.

An insulating layer 802 is deposited on the whole structure, up until a level higher than the upper level of the part 20 made of germanium, so as to obtain a structure the upper surface of which is plane. For instance, the layer 802 is self-planarizing, for example, made of silicon oxide containing PSG (Phosphorus Silicate Glass) phosphorus, and is deposited directly with a plane upper face. According to another example, a chemical-mechanical planarization (CMP) stage is provided after the depositing of the layer 802.

Conductive vias 803 are then formed through the entire thickness of the layer 802, up until the contact areas 500, so as to electrically connect the area 101 to a first terminal of the photodiode 2. In a similar manner, at least one conductive via 804 is formed through the entire thickness of the layer 802 up until the part 20 made of germanium, so as to electrically connect the part 20 made of germanium to a second terminal of the photodiode 2. The vias 803 and 804 can be formed simultaneously.

The method described above is compatible with methods for manufacturing electronic circuits using CMOS technology.

In the particular example embodiment of a photodiode 2, illustrated in FIG. 8, when the photodiode is biased to the rest voltage Vp, the interface between the silicon 10 and the germanium 20 is depleted at the lower face of the germanium, i.e., at the face of the part 10 on which the germanium 20 lies.

Moreover, in this example embodiment of a SPAD photodiode, a parasitic, i.e., not photogenerated, charge carrier can be created at the vertical interface between the germanium 20 and the area 102 made of silicon. The area 401 makes it possible to stop this parasitic carrier from reaching the avalanche zone. In particular, the interface between the area 401 and the germanium 20 is protected from depletion since the area 401 is more heavily p-type doped than the area 102 in which it is located, which makes it possible to preserve the potential barrier corresponding to the heterojunction between the area 401 made of silicon and the germanium 20.

The structure illustrated in FIG. 8 can be mounted on an integrated circuit chip and be electrically connected to the latter by contacting the ends of the vias 803 and 804 with electrical connection pads of the integrated circuit chip.

What is indicated in the foregoing for the photodiode of FIG. 8 also applies when the layer 104 is omitted, i.e., when the photodiode is the type shown in FIG. 1.

Various embodiments and variants have been described. Those skilled in the art will understand that certain features of these embodiments can be combined and other variants will readily occur to those skilled in the art. In particular, the manner in which the area 101 is connected to a corresponding via 803 is not limited to the use of areas 500 as described in relation to FIG. 5, the via 803, for example, potentially traversing the layer 400 up to the area 101. Furthermore, although embodiments of SPAD photodiodes in which the avalanche effect is triggered by a photogenerated electron have been described in the foregoing by way of example, these embodiments can be adapted to the case in which the avalanche effect is triggered by a photogenerated hole by reversing all the types of conductivity.

Finally, the practical implementation of the embodiments and variants described herein is within the capabilities of those skilled in the art based on the functional description provided hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a first silicon layer doped with a first type of conductivity;
   forming a second silicon layer doped with a second type of conductivity vertically adjacent to the first silicon layer;
   etching a cavity into the second silicon layer; and
   forming a germanium layer doped with the second type of conductivity by an epitaxy process from the second silicon layer so as to fill the cavity, the germanium layer being vertically adjacent to the second silicon layer, a doping concentration of the germanium layer increasing toward a distal surface of the germanium layer with respect to the second silicon layer.

2. The method according to claim 1, further comprising forming an annular layer in the second silicon layer by doping an annular portion of the second silicon layer more heavily with the second type of conductivity than another portion of the second silicon layer, the annular portion exposed through the cavity.

3. The method according to claim 1, further comprising, before the formation of the germanium layer, forming a doped region of the first type of conductivity in the second silicon layer, the doped region being in contact with the germanium layer.

4. The method according to claim 1, wherein the first silicon layer is formed in a substrate of silicon, and the forming the second silicon layer includes:
   forming an epitaxy layer of silicon from the substrate; and
   doping a portion of the epitaxial layer of silicon with the second type of conductivity through a whole thickness of the epitaxy layer of silicon.

5. A method, comprising:
   forming a photodiode by:
      forming a germanium layer on a first surface of a substrate, the germanium layer having a first conductivity type, the germanium layer having an increasing doping concentration from the first surface to a second surface of the germanium layer, wherein
   the substrate includes a first silicon layer of a second conductivity type that is different from the first conductivity type, a second silicon layer of the first conductivity type that is between the first silicon layer and the first surface of the substrate, and a third silicon layer of the second conductivity type between the first surface of the substrate and the second silicon layer.

6. A method, comprising:
   forming a photodiode by:
      forming a first doped region in a substrate, the first doped region having a first conductivity type;
      forming a silicon layer on the substrate;
      forming a second doped region in the silicon layer, the second doped region having a second conductivity type that is different from the first conductivity type;
      forming an opening in the second doped region;
      forming a germanium layer in the opening, the germanium layer having the second conductivity type, the germanium layer having a heavier doping concentration than the second doped region.

7. The method of claim 6 wherein forming the photodiode includes forming a third doped region in the second doped region before forming the germanium layer.

8. The method of claim 7 wherein forming the third doped region includes forming the third doped region to have the first conductivity type.

9. The method of claim 8 wherein forming the photodiode includes forming fourth doped regions in the silicon layer, the second doped region being between the fourth doped regions, the fourth doped regions having the first conductivity type.

10. The method of claim 9 wherein the second doped region has a first dimension in a first direction and the opening has a second dimension in the first direction, the second dimension being smaller than the first dimension, walls of the opening including a higher doping concentration than the second doped region.

11. The method of claim 10 wherein the walls have the second conductivity type.

12. The method of claim 6 wherein forming the germanium layer extends past a first surface of the silicon layer and forming the photodiode includes forming an insulating layer on the germanium layer and on the first surface of the silicon layer.

13. The method of claim 12 including forming a layer of nitride on the germanium layer and on a portion of the first surface of the silicon layer.

14. The method of claim 13 including forming a contact through the insulating layer and in contact with the nitride layer.

15. A method, comprising:
   forming a first silicon layer doped with a first type of conductivity in a substrate of silicon;
   forming a second silicon layer doped with a second type of conductivity vertically adjacent to the first silicon layer, the forming of the second silicon layer including:
      forming an epitaxy layer of silicon from the substrate; and
      doping a portion of the epitaxial layer of silicon with the second type of conductivity through a whole thickness of the epitaxy layer of silicon; and
   forming a germanium layer doped with the second type of conductivity vertically adjacent to the second silicon layer, a doping concentration of the germanium layer increasing toward a distal surface of the germanium layer with respect to the second silicon layer.

16. The method according to claim 15, further comprising, before the formation of the germanium layer, forming a doped region of the first type of conductivity in the second silicon layer, the doped region being in contact with the germanium layer.

17. The method according to claim 5, wherein the forming an annular layer in the second silicon layer by doping an annular portion of the second silicon layer more heavily with the first conductivity type than another portion of the second silicon layer.

* * * * *